United States Patent
Zhou et al.

(10) Patent No.: US 9,729,254 B1
(45) Date of Patent: Aug. 8, 2017

(54) APPARATUS AND METHOD FOR PROVIDING EAST SECOND ORDER INPUT INTERCEPT POINT CALIBRATION BASED ON TWO TONE TESTING

(71) Applicant: Samsung Electronics Co., Ltd., Gyeonggi-do (KR)

(72) Inventors: Quan Zhou, Sunnyvale, CA (US); Zhiyu Yang, Dublin, CA (US)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/156,972

(22) Filed: May 17, 2016

Related U.S. Application Data

(60) Provisional application No. 62/310,187, filed on Mar. 18, 2016.

(51) Int. Cl.
*H04B 17/21* (2015.01)
*H04B 1/10* (2006.01)
*H03D 7/16* (2006.01)
*H04B 1/30* (2006.01)

(52) U.S. Cl.
CPC ............ *H04B 17/21* (2015.01); *H03D 7/165* (2013.01); *H04B 1/109* (2013.01); *H04B 1/30* (2013.01); *H03D 2200/005* (2013.01); *H03D 2200/0052* (2013.01); *H03D 2200/0066* (2013.01); *H03D 2200/0082* (2013.01)

(58) Field of Classification Search
CPC combination set(s) only.
See application file for complete search history.

(56) References Cited

U.S. PATENT DOCUMENTS

| | | | |
|---|---|---|---|
| 7,742,747 B2 | 6/2010 | Manku et al. | |
| 8,010,074 B2 | 8/2011 | Kaczman et al. | |
| 8,150,350 B2 | 4/2012 | Pratt et al. | |
| 8,787,864 B2 | 7/2014 | Leung et al. | |
| 9,002,310 B2 | 4/2015 | Dufrene et al. | |
| 9,154,244 B2 | 10/2015 | Feng et al. | |
| 2009/0186587 A1* | 7/2009 | Sobchak | H04B 1/30 455/196.1 |
| 2010/0093298 A1* | 4/2010 | Pratt | H04B 17/21 455/226.1 |
| 2010/0120369 A1 | 5/2010 | Ko et al. | |
| 2011/0128992 A1* | 6/2011 | Maeda | H04B 17/0085 375/130 |
| 2014/0226759 A1 | 8/2014 | Han et al. | |

(Continued)

OTHER PUBLICATIONS

Peichen Jiang et al., All-digital adaptive module for automatic background iip2 calibration in cmos downconverters with fast convergence Circuits and Systems II: Express Briefs, IEEE Transactions on, May 16, 2013, pp. 427-431 ISSN : 1549-7747, INSPEC Accession No. 13705189 DOI: 10.1109/TCSII.2013.226.

*Primary Examiner* — Junpeng Chen
(74) *Attorney, Agent, or Firm* — The Farrell Law Firm, P.C.

(57) ABSTRACT

An apparatus and a method. The apparatus includes a first low pass filter (LPF), a second LPF, a first analog-to-digital converter (ADC), a second ADC, a first discrete Fourier transform (DFT) unit, a second DFT unit, a second order intermodulation (IM2) tone amplitude measurement unit, and a calibration logic unit configured to simultaneously determine an in-phase mixer (I-mixer) digital-to-analog (DAC) code and a quadrature-phase mixer (Q-mixer) DAC code.

20 Claims, 8 Drawing Sheets

(56) References Cited

U.S. PATENT DOCUMENTS

2014/0355456 A1 12/2014 Jiang et al.
2015/0256214 A1 9/2015 Lee
2015/0333850 A1 11/2015 Myoung et al.

* cited by examiner

APPARATUS AND METHOD FOR PROVIDING EAST SECOND ORDER INPUT INTERCEPT POINT CALIBRATION BASED ON TWO TONE TESTING

PRIORITY

This application claims priority under 35 U.S.C. §119(e) to a U.S. Provisional Patent Application filed on Mar. 18, 2016 in the United States Patent and Trademark Office and assigned Ser. No. 62/310,187, the entire contents of which are incorporated herein by reference.

FIELD

The present disclosure relates generally to an apparatus and a method for providing second order intercept point (IIP2) calibration, and more particularly, to an apparatus and method for providing fast IIP2 calibration based on two tone testing.

BACKGROUND

IIP2 calibration is a stringent requirement for a cellular frequency division duplex (FDD) system due to finite isolation between a transmitter and a receiver. Due to a strong dependency between an in-phase path (I-path) and a quadrature-phase path (Q-path) during IIP2 calibration, an exhaustive search to find an optimal digital-to-analog converter (DAC) code that minimizes the I-path and Q-path second order intermodulation (IM2) tone amplitude simultaneously is frequently performed. An exhaustive search may be time consuming.

Alternatively, an iterative search may be performed. However, an iterative search method suffers from a convergence issue within a few iterations due to IQ path dependency.

A searching speed to determine an optimal DAC code that minimizes IM2 tone amplitude may be slower for an apparatus with multiple bands and channels such as a long term evolution (LTE) FDD system. A binary search method to determine the optimal DAC code that minimizes IM2 tone amplitude requires at least $2^N$ searches to determine the optimal DAC code, where N is the number of bits in one calibration code. The effect of second order nonlinearity generates an in-band interference term caused by a leaked transmit signal, which degrades receiver sensitivity.

SUMMARY

According to one embodiment, an apparatus includes a first low pass filter (LPF), including an input configured to receive a real part of an IM2 tone, and an output; a second LPF, including an input configured to receive an imaginary part of the IM2 tone, and an output; a first analog-to-digital converter (ADC), including a first input connected to the output of the first LPF, and an output; a second ADC, including a first input connected to the output of the second LPF, and an output; a first discrete Fourier transform (DFT) unit, including an input connected to the output of the first ADC, and an output; a second DFT unit, including an input connected to the output of the second ADC, and an output; an IM2 tone amplitude measurement unit, including a first input connected to the output of the first DFT, a second input connected to the output of the second DFT, and an output, and a calibration logic unit, including an input connected to the output of the IM2 tone amplitude measurement unit, a first output, and a second output, configured to simultaneously determine an in-phase mixer (I-mixer) DAC code and a quadrature-phase mixer (Q-mixer) DAC code.

According to one embodiment, a method includes receiving, by a first low pass filter (LPF), a real part of a second order intermodulation (IM2) tone; receiving, by a second LPF, an imaginary part of the IM2 tone; converting, by a first analog-to-digital converter (ADC), an output of the first LPF; converting, by a second ADC, an output of the second LPF; transforming, by a first discrete Fourier transform (DFT) unit, an output of the first ADC; transforming, by a second DFT unit, an output of the second ADC; measuring, by an IM2 tone amplitude measurement unit, an output of the second DFT; and determining simultaneously an in-phase mixer (I-mixer) digital-to-analog (DAC) code and a quadrature-phase mixer (Q-mixer) DAC code, by a calibration logic unit, from an output of the IM2 tone amplitude measurement unit.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION OF EMBODIMENTS OF THE PRESENT DISCLOSURE

Figure 1:
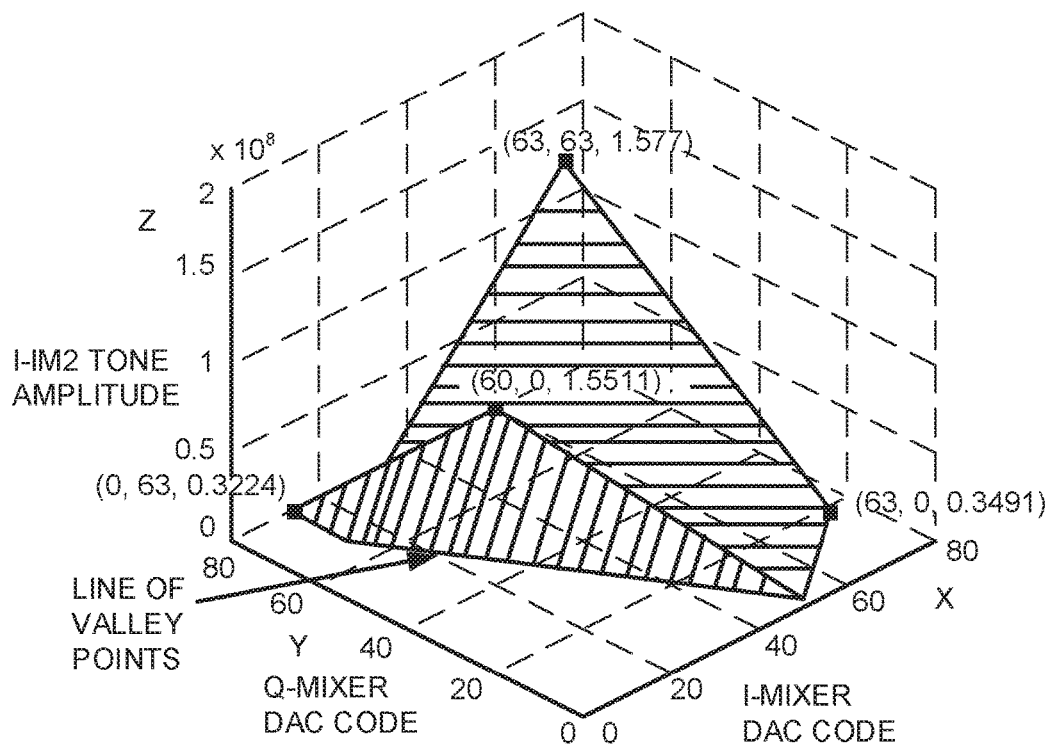
FIG. 1 is a three dimensional (3D) graph of IM2 tone amplitude, I-mixer DAC code, and Q-mixer DAC code based on amplitudes of real parts of a Discrete Fourier Transform (DFT) of captured data, according to an embodiment of the present disclosure.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope and spirit of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the spirit and the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Such terms as those defined in a generally used dictionary are to be interpreted to have the same meanings as the contextual meanings in the relevant field of art, and are not to be interpreted to have ideal or excessively formal meanings unless clearly defined in the present disclosure.

IIP2 calibration may require joint optimization, because there is a strong dependency between an I-path and a Q-path in IIP2 calibration. Typically, an exhaustive search or an iterative search is used to determine an optimum I-path DAC code (or I-mixer DAC code) and an optimum Q-path DAC code (or Q-mixer DAC code). However, an exhaustive search method or an iterative search method requires numerous computations, which consume time.

FIG. 1 is a 3D plot of IM2 tone amplitude, I-mixer DAC code, and Q-mixer DAC code based on amplitudes of real parts of a DFT of captured data, according to an embodiment of the present disclosure, where the z-axis represents IM2 tone amplitude, the x-axis represents the I-mixer DAC code, and the y-axis represents the Q-mixer DAC code.

Figure 2:
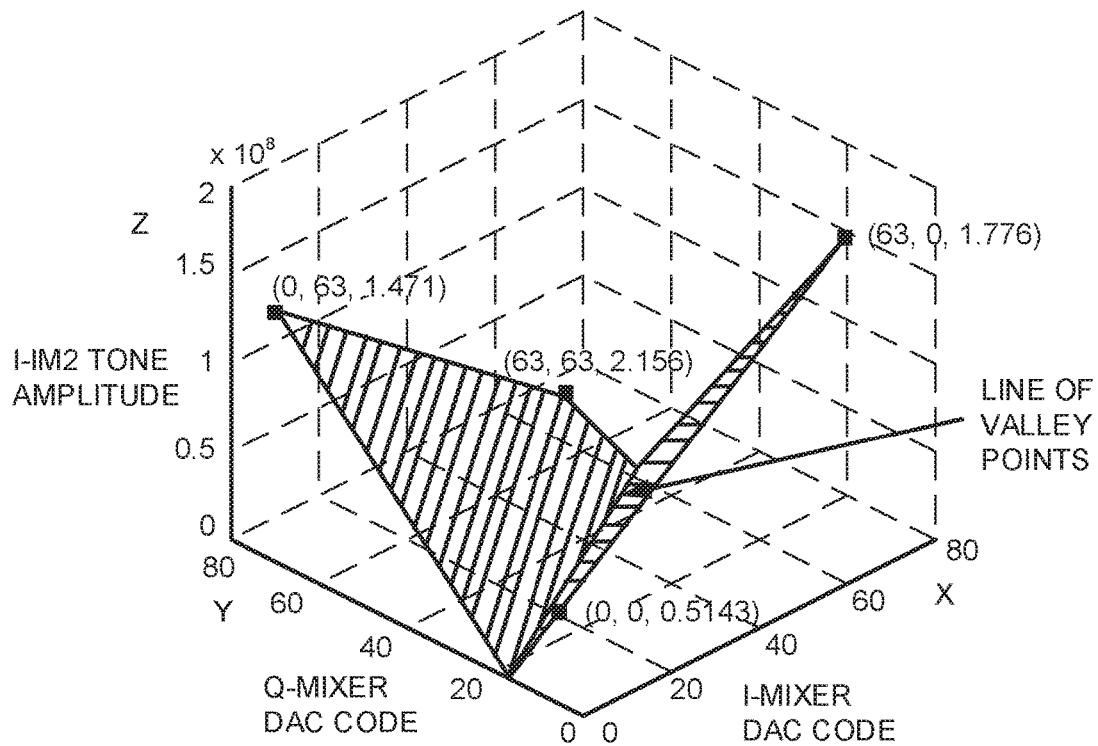
FIG. 2 is a 3D graph of IM2 tone amplitude, I-mixer DAC code, and Q-mixer DAC code based on amplitudes of imaginary parts of a DFT of captured data, according to an embodiment of the present disclosure.

FIG. 2 is a 3D plot of IM2 tone amplitude, I-mixer DAC code, and Q-mixer DAC code based on amplitudes of imaginary parts of the DFT of the captured data used to generate FIG. 1, according to an embodiment of the present disclosure.

According to FIGS. 1 and 2, there is a linear relationship between IM2 tone amplitude and I,Q DAC code space. The present disclosure uses this linear relationship to provide a fast searching method and apparatus for simultaneously optimizing a joint IQ DAC code for IIP2 calibration that requires as few as four iterations of capturing data (or data captures).

Based on one or more plane-fitting techniques, the wing-shaped surfaces illustrated in FIGS. 1 and 2 approach a 3D plane. Therefore, the collection of the points (or valley points) at the intersection of two planes (or wings) corresponds to a minimum IM2 tone amplitude of the wings in FIG. 1 and FIG. 2, where the valley points in each of FIGS. 1 and 2 form a straight line. The optimal I-mixer DAC code and the optimal Q-mixer DAC code may be determined simultaneously by determining the intersection of the two line segments formed by the valley points.

Figure 3:
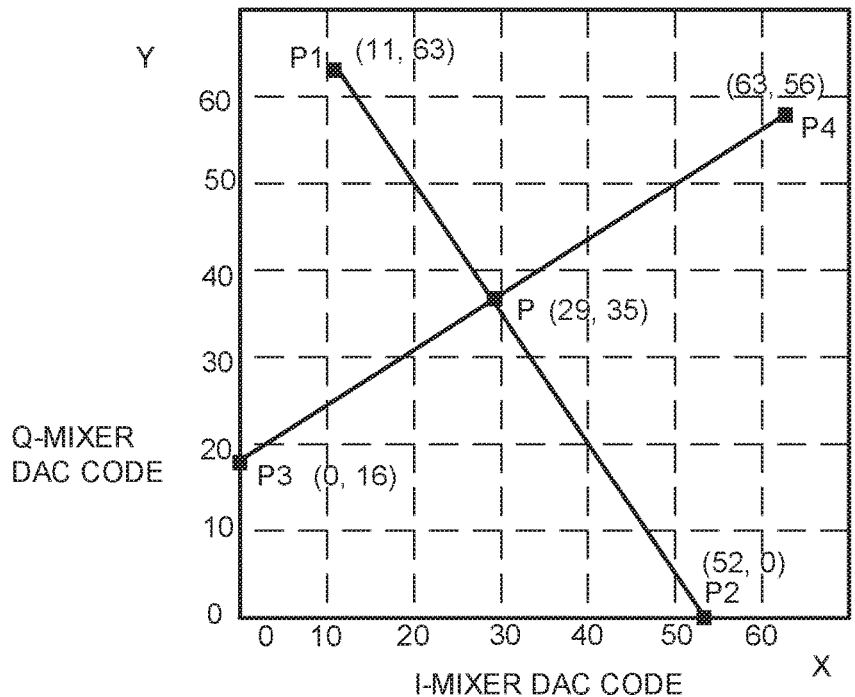
FIG. 3 is a graph for determining an optimal I-mixer DAC code and an optimal Q-mixer DAC code simultaneously, according to an embodiment of the present disclosure.

FIG. 3 is a graph for determining an optimal I-mixer DAC code and an optimal Q-mixer DAC code simultaneously, according to an embodiment of the present disclosure.

Referring to FIG. 3, the line from point P1 to point P2 illustrates the collection of valley points in FIG. 1, while the line from point P3 to the point P4 illustrates the collection of valley points in FIG. 2. The x and y coordinates of an intersection point P provides an optimal I-mixer DAC code and an optimal Q-mixer DAC code, respectively. At intersection point P, the I-mixer and Q-mixer IM2 amplitudes are minimized simultaneously. Thus, the optimal calibration DAC code is the crossing point P between the two line segments.

In the related art, a method frequently used is based on a binary search on IP2($I^2+Q^2$). The present disclosure uses the linear property of IP2(|I|), IP2(|Q|), and IQ DAC code space, respectively. A first line representing the valley points of a 3D plot of IM2 tone amplitude, I-mixer DAC code, and Q-mixer DAC code based on amplitudes of real parts of a DFT of captured data is generated. A second line representing and the valley points of a 3D plot of IM2 tone amplitude, I-mixer DAC code, and Q-mixer DAC code based on amplitudes of imaginary parts of the DFT of the captured data used to generate the first line is generated. Since only two points are needed to generate a line, as few as four data captures are required to determine the first line and the second line. The x and y coordinates of an intersection point of the first line and the second line is determined as the optimal I-mixer DAC code and the optimal Q-mixer DAC code, respectively.

The optimal I-mixer DAC code and Q-mixer DAC code determined by the present disclosure provides an accuracy comparable to the exhaustive search method, with a search time that is greatly reduced as compared to an exhaustive search method.

Table 1 below describes an example of how to determine four points P1, P2, P3 and P4 (e.g., from FIG. 3) for determining a first line and a second line, where the intersection of the first line and the second line provides optimal locations of an I-mixer DAC code and a Q-mixer DAC code. While Table 1 below uses fixed coordinates 0 and 63, the present disclosure is not limited thereto, and other fixed coordinates may be used without departing from the scope of the present disclosure.

TABLE 1

| | |
|---|---|
| x-coordinate of P1 | optimal location of I-DAC code when Q-mixer DAC is fixed at 63 |
| x-coordinate of P2 | optimal location of I-DAC code when Q-mixer DAC is fixed at 0 |
| y-coordinate of P3 | optimal location of Q-DAC code when I-mixer DAC is fixed at 0 |
| y-coordinate of P4 | optimal location of Q-DAC code when I-mixer DAC is fixed at 63 |

Based on the linear relationship, any coordinate $P_i$, $1 \leq i \leq 4$ may be determined using only two data captures, where one data capture may be paired with more than one other data capture to determine more than one coordinate.

Figure 4:
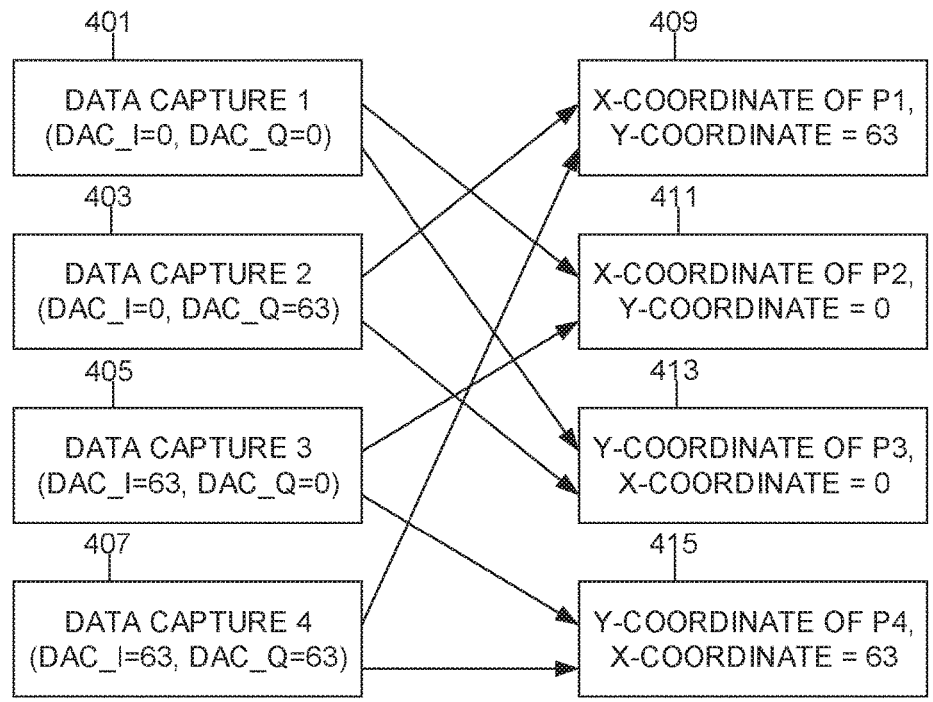
FIG. 4 is an illustration of which pairs of four captured data points may be used to determine the points P1-P4 in FIG. 3, according to an embodiment of the present disclosure.

FIG. 4 is an illustration of which pairs of four captured data points may be used to determine the points P1-P4 in FIG. 3, according to an embodiment of the present disclosure.

Referring to FIG. 4, four coordinates (e.g., the x-coordinate of P1, the x-coordinate of P2, the y-coordinate of P3, and the y-coordinate of P4) are determined based on four data captures. The present IIP2 calibration apparatus and method performs four data captures under the four [I, Q] DAC code settings, e.g., data capture 1 [I_DAC=0, Q_DAC=0] at 401, data capture 2 [I_DAC=0, Q_DAC=63] at 403, data capture 3 [I_DAC=63, Q_DAC=0] at 405, and data capture 4 [I_DAC=63, Q_DAC=63] at 407. The present apparatus and method further performs DFT computation at IM2 tone locations on the real part and the imaginary part of the data captures, respectively. The present apparatus and method further determines four coordinates as follows. At 409, the present apparatus determines an x-coordinate of P1 based on amplitudes of a DFT of a real part of the data capture 2 and a real part of the data capture 4. At 411, the present apparatus determines an x-coordinate of P2 based on amplitudes of a DFT of a real part of the data capture 1 and the real part of the data capture 3 At 413, the present apparatus determines a y-coordinate of P3 based on amplitudes of a DFT of an imaginary part of the data capture 1 and an imaginary part of the data capture 2. At 415, the present apparatus determines a y-coordinate of P4 based on amplitudes of a DFT of the imaginary part of the data capture 3 and the imaginary part of data capture 4. After P1, P2, P3 and P4 are determined, the present apparatus and method may further determine the coordinates of an intersection point P of two lines formed by P1, P2, P3, and P4 (e.g., a first lined formed from P1 to P2 and a second line formed from P3 to P4).

Figure 5:
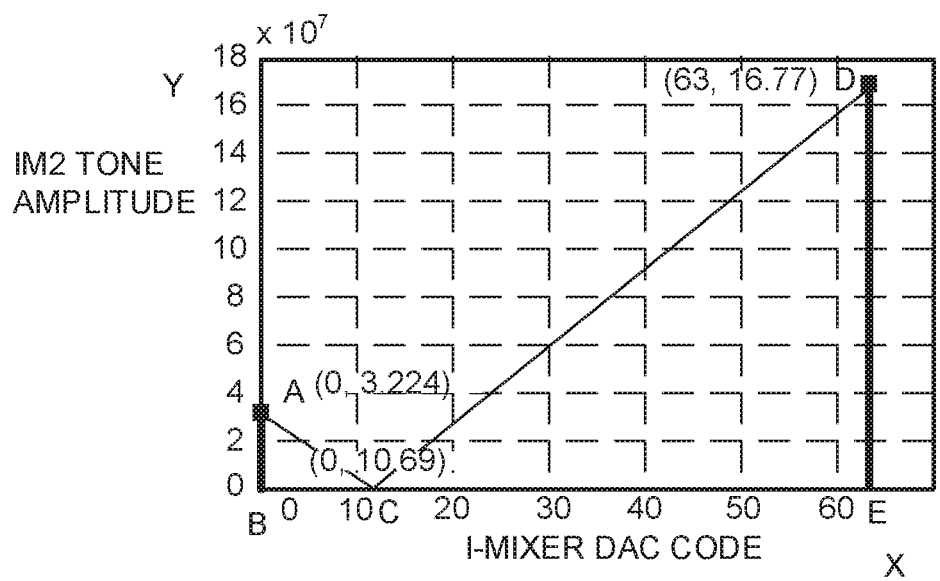
FIG. 5 is a graph for determining an x-coordinate of point P1 in FIG. 3, according to an embodiment of the present disclosure.

FIG. 5 is a graph for determining an x-coordinate of point P1 in FIG. 3, according to an embodiment of the present disclosure.

Referring to FIG. 5, the present apparatus and method determines the lengths of line AB and line DE. Then, the present apparatus and method determines the location of the point C based on a similarity between the two triangles (As), i.e., $\triangle ABC \sim \triangle DEC$, where Equation (1) may be used to determine the length of a line from point B to point C as follows:

$$|BC| = \frac{|AB| \times |BE|}{|AB| + |DE|} \quad (1)$$

Thus, for $A=3.224 \times 10^7$, $B=0$, $D=16.77 \times 10^7$, and $E=63$, $$|BC| = \frac{|AB| \times |BE|}{|AB| + |DE|} = \frac{3.224 \times 10^7 \times 63}{3.224 \times 10^7 + 16.77 \times 10^7} = 10.69.$$

Since, B is 0, the result represents the x-coordinate of C.

Determining the length of line AB requires a data capture based on DAC_I=0 and DAC_Q=63. Determining the length of DE requires a data capture based on DAC_I=63 and DAC_Q=63. In similar fashion, the x-coordinate of P2, the y-coordinate of P3, and the y-coordinate of P4, which are the valley points shown in the FIGS. 6-8, respectively, can be determined.

Figure 6:
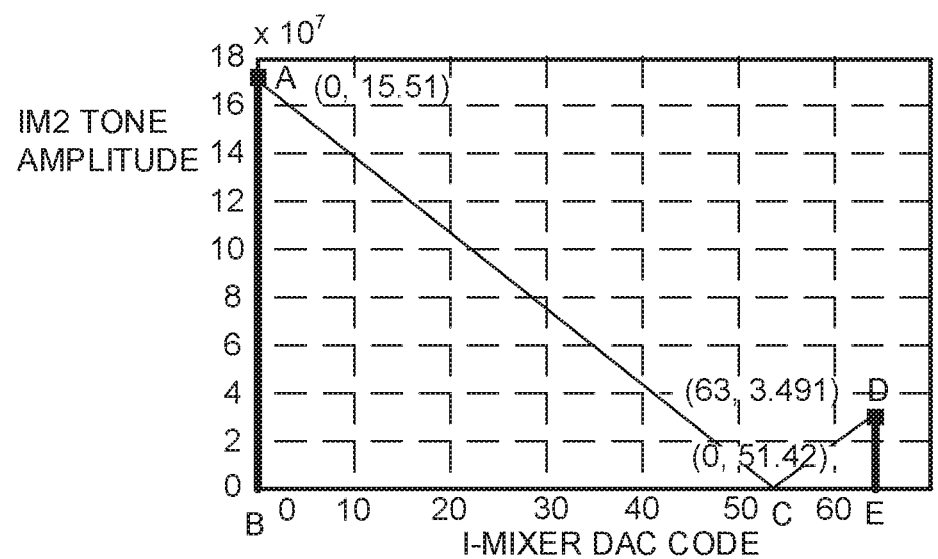
FIG. 6 is a graph for determining an x-coordinate of point P2 in FIG. 3, according to an embodiment of the present disclosure.

FIG. 6 is a graph for determining an x-coordinate of point P2 in FIG. 3, according to an embodiment of the present disclosure. For $A=15.51 \times 10^7$, $B=0$, $D=3.491 \times 10^7$, and $E=63$, $$|BC| = \frac{|AB| \times |BE|}{|AB| + |DE|} = \frac{15.51 \times 10^7 \times 63}{15.51 \times 10^7 + 3.491 \times 10^7} = 51.42.$$

Since, B is 0, the result represents the x-coordinate of C.

Figure 7:
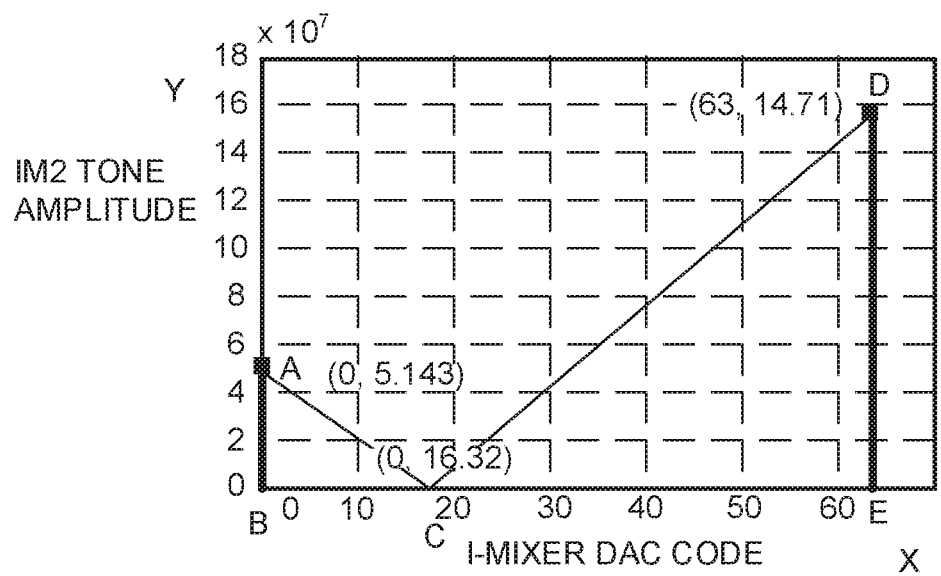
FIG. 7 is a graph for determining an y-coordinate of point P3 in FIG. 3, according to an embodiment of the present disclosure.

FIG. 7 is a graph for determining a y-coordinate of point P3 in FIG. 3, according to an embodiment of the present disclosure. For $A=5.143 \times 10^7$, $B=0$, $D=14.71 \times 10^7$, and $E=63$, $$|BC| = \frac{|AB| \times |BE|}{|AB| + |DE|} = \frac{5.143 \times 10^7 \times 63}{5.143 \times 10^7 + 14.71 \times 10^7} = 16.32.$$

Since, B is 0, the result represents the x-coordinate of C.

Figure 8:
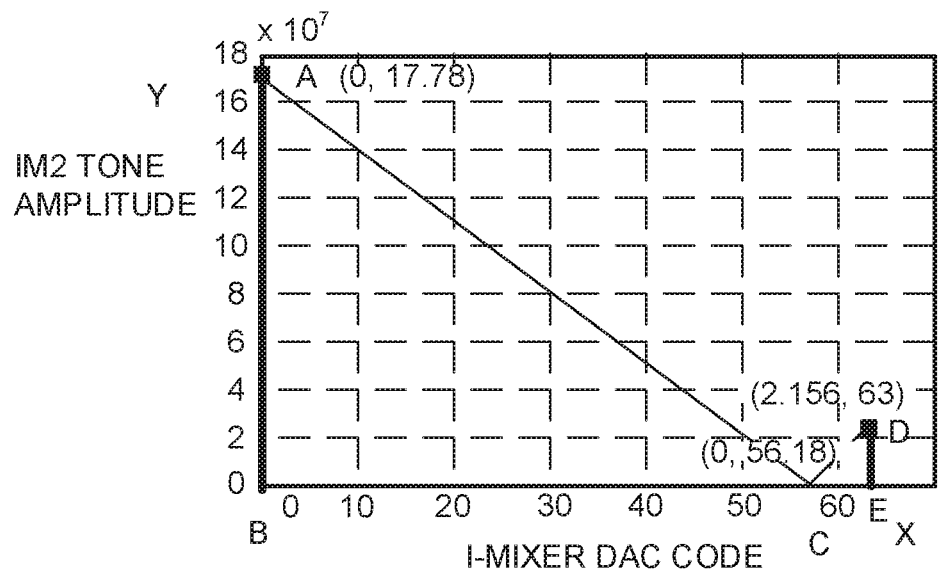
FIG. 8 is a graph for determining an y-coordinate of point P4 in FIG. 3, according to an embodiment of the present disclosure.

FIG. 8 is a graph for determining a y-coordinate of point P4 in FIG. 3, according to an embodiment of the present disclosure. For $A=17.78 \times 10^7$, $B=0$, $D=2.156 \times 10^7$, and $E=63$, $$|BC| = \frac{|AB| \times |BE|}{|AB| + |DE|} = \frac{17.78 \times 10^7 \times 63}{17.78 \times 10^7 + 2.156 \times 10^7} = 56.18.$$

Since, B is 0, the result represents the x-coordinate of C.

Figure 9:
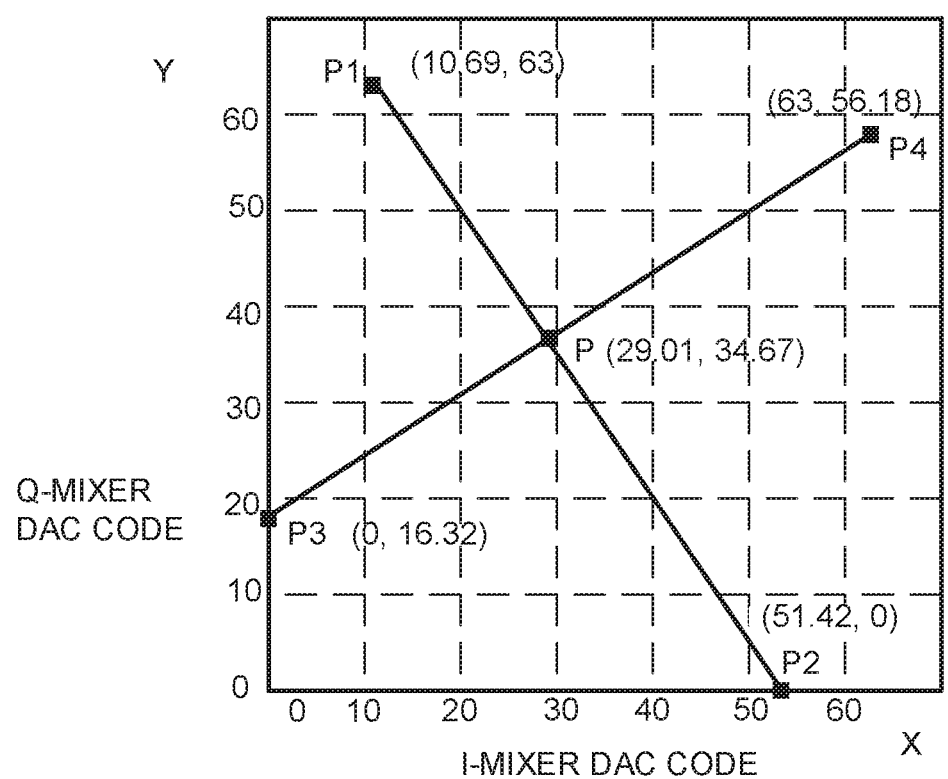
FIG. 9 is a graph for determining an optimal I-mixer DAC code and an optimal Q-mixer DAC code simultaneously using coordinates determined for the points P1-P4 in FIG. 3, according to an embodiment of the present disclosure.

FIG. 9 is a graph for determining an optimal I-mixer DAC code and an optimal Q-mixer DAC code simultaneously using coordinates determined for the points P1-P4 in FIG. 3, according to an embodiment of the present disclosure.

Referring to FIG. 9, the present apparatus and method uses P1 (e.g., 10.69, 63), P2 (e.g., 51.42, 0), P3 (e.g., 0, 16.32), and P4 (e.g., (63, 56.18) to determine a first line from P1 to P2 and a second line from P3 to P4. The coordinates of the intersection of the first line and the second line (i.e., point P) are the optimal I-mixer DAC code and the optimal Q-mixer DAC code, respectively. For the values in FIG. 9, the coordinates of P may be rounded to (29, 35).

Figure 10:
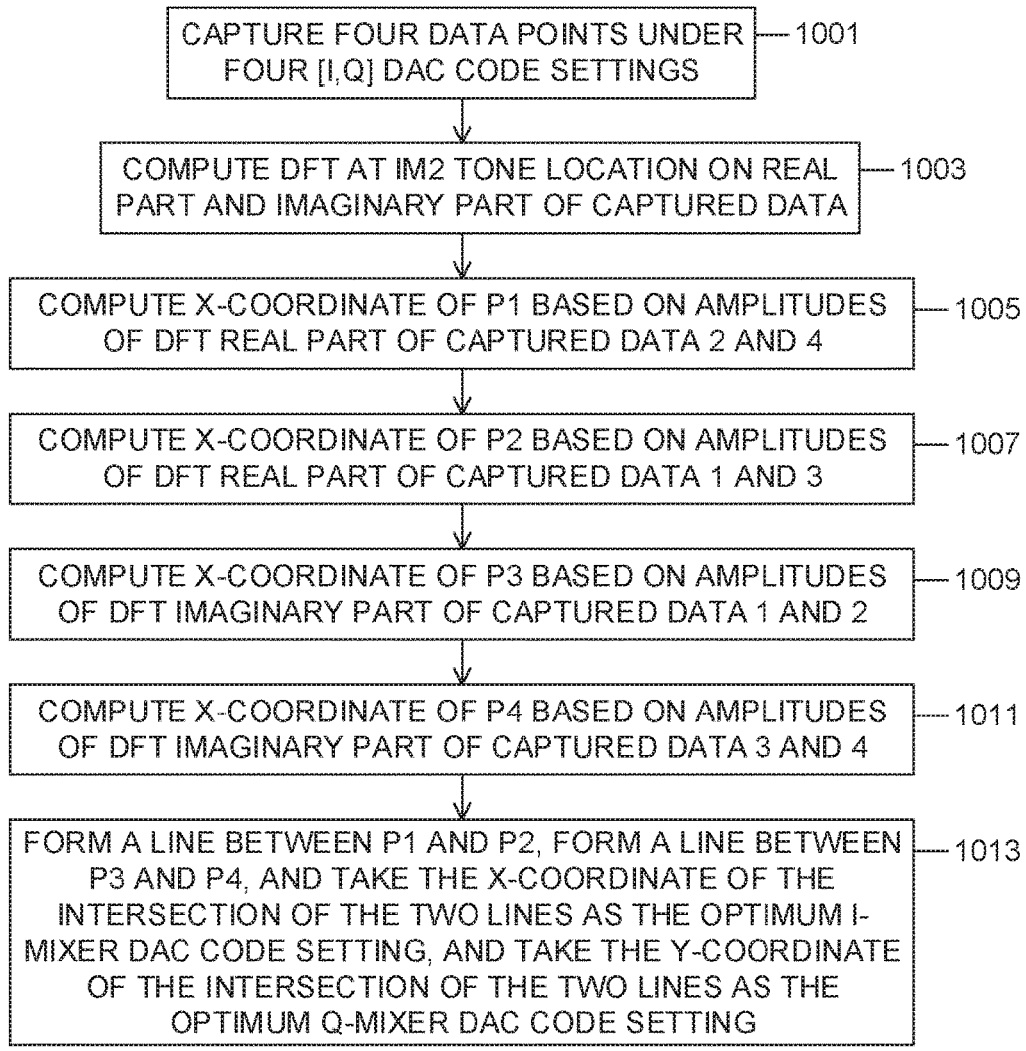
FIG. 10 is a flowchart of a method of determining an optimal I-mixer DAC code and an optimal Q-mixer DAC code simultaneously, according to an embodiment of the present disclosure.

FIG. 10 is a flowchart of a method of determining an optimal I-mixer DAC code and an optimal Q-mixer DAC code simultaneously, according to an embodiment of the present disclosure.

Referring to FIG. 10, the apparatus and method of the present disclosure captures four data points (captured data 1, captured data 2, captured data 3, and captured data 4) under four [I,Q] DAC code settings at 1001.

At 1003, the apparatus and method of the present disclosure computes a DFT at an IM2 tone location on a real part and an imaginary part of the captured data.

At 1005, the apparatus and method of the present disclosure computes an x-coordinate of a point P1 based on amplitudes of the DFT real part of captured data 2 and 4.

At 1007, the apparatus and method of the present disclosure computes an x-coordinate of a point P2 based on amplitudes of the DFT real part of captured data 1 and 3.

At 1009, the apparatus and method of the present disclosure computes an x-coordinate of a point P3 based on amplitudes of the DFT imaginary part of captured data 1 and 2.

At 1011, the apparatus and method of the present disclosure computes an x-coordinate of a point P4 based on amplitudes of the DFT imaginary part of captured data 3 and 4.

At 1013, the apparatus and method of the present disclosure forms a first line from P1 to P2, forms a second line from P3 to P4, and determines the x-coordinate of a point P at the intersection of the first line and the second line as the optimal I-mixer DAC code setting, and determines the y-coordinate of P as the optimal Q-mixer DAC code setting.

Figure 11:
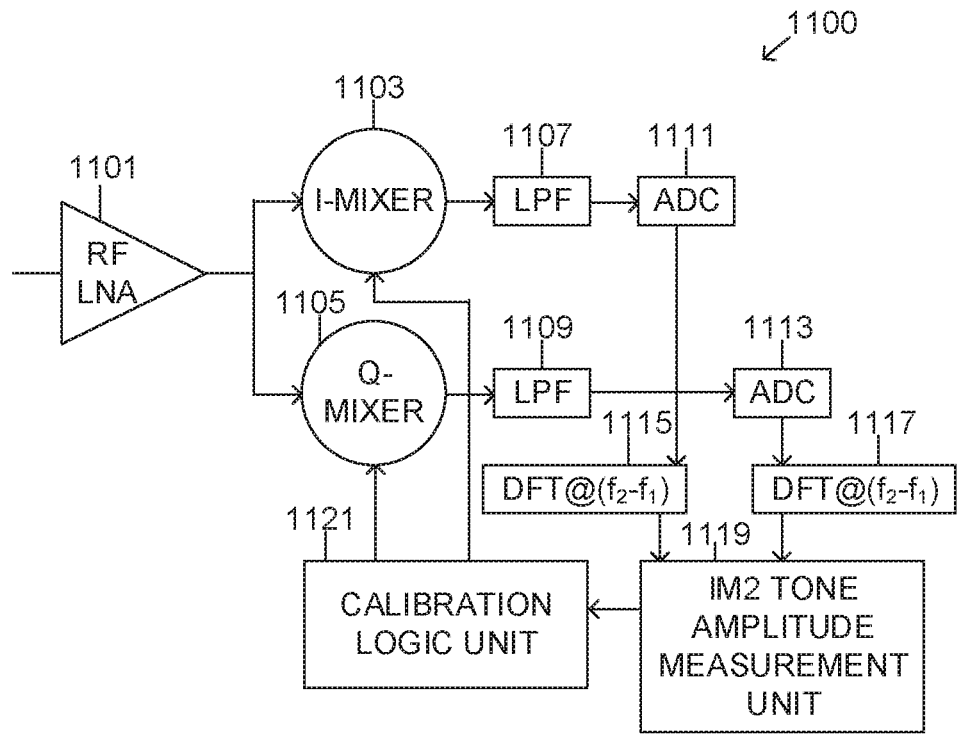
FIG. 11 is a block diagram of an apparatus for providing a fast IIP2 calibration based on two tone testing, according to an embodiment of the present disclosure.

FIG. 11 is a block diagram of an apparatus 1100 for providing a fast IIP2 calibration based on two tone testing, according to an embodiment of the present disclosure. IM2 tone amplitude measurement using DFT may be implemented in software for flexibility, i.e., two tone spacing may be chosen flexibly.

Referring to FIG. 11, the apparatus 1100 includes a radio frequency (RF) low noise amplifier (LNA) 1101, an I-mixer 1103, a Q-mixer 1105, a first low pass filter (LPF) 1107, a second LPF 1109, a first analog-to-digital converter (ADC) 1111, a second ADC 1113, a first DFT 1115, a second DFT 1117, an IM2 tone amplitude measurement unit 1119, and a calibration logic unit 1121.

The RF LNA 1101 includes an input for receiving two tones at frequencies $f_1$ and $f_2$, respectively, for IIP2 calibration, where the two tones are generated either externally or internally, and an output.

The I-mixer 1103 includes a first input connected to the output of the RF LNA 1101, a second input for receiving an I-mixer DAC code setting from the calibration logic unit 1121, and an output.

The present apparatus and method may generate a baseband tone with frequency $(f_2-f_1)/2$. After I-mixing, the two tones' frequency spacing in the passband becomes $(f_2-f_1)$. Calibration is not affected by whether the two tones are generated internally or externally.

The Q-mixer 1105 includes a first input connected to the output of the RF LNA 1101, a second input for receiving a Q-mixer DAC code setting from the calibration logic unit 1121, and an output.

The first LPF 1107 includes an input connected to the output of the I-mixer 1103, and an output.

The second LPF 1109 includes an input connected to the output of the Q-mixer 1105, and an output.

The present apparatus and method transmits two tones with frequencies that are $f_{tx}+f_1$ and $f_{tx}+f_2$ respectively, where $f_{tx}$ is the center frequency of the transmit band, and the tone spacing $|f_2-f_1|<f_c$, where $f_c$ is the cut-off frequency of the receiver LPFs 1107 and 1109. The I-mixer 1103 and the Q-mixer 1105 operate at $f_{rx}$, where $f_{rx}$ is the center frequency of the receiver band, and $f_{offset}=f_{rx}-f_{tx}$ is the duplex spacing, which is usually much greater than $f_c$.

The first ADC 1111 includes an input connected to the output of the first LPF 1107, and an output.

The second ADC 1113 includes an input connected to the output of the second LPF 1109, and an output.

The first DFT 1115 includes an input connected to the output of the first ADC 1111, and an output.

The second DFT 1117 includes an input connected to the output of the second ADC 1113, and an output.

After the I-mixer 1103 and the Q-mixer 1105, the IM2 tone falls within an analog baseband (ABB) and is captured by the ADCs 1111 and 1113, while two testing tones $f_{tx}+f_1$ and $f_{tx}+f_2$ are filtered out by the ABB LPFs 1107 and 1109. When data capture is completed, the present apparatus and method performs a DFT on the IM2 tone.

The IM2 tone amplitude measurement unit 1119 includes a first input connected to the output of the first DFT 1115, a second input connected to the output of the second DFT 1117, and an output. The IM2 tone amplitude measurement unit 1119 measures the amplitude of the captured data.

The calibration logic unit 1121 includes an input connected to the output of the IM2 tone amplitude measurement unit 1119, a first output connected to the second input of the I-mixer 1103, and a second output connected to the second input of the Q-mixer 1105. The calibration logic unit 1121 receives the IM2 tone amplitude measurements of the captured data for at least points P1, P2, P3, and P4, sets the y-coordinate of P1 and the x-coordinate of P4 to a first value, sets the y-coordinate of P2 and the x-coordinate of P3 to a second value, determines the x-coordinates of P1 and P2, determines the y-coordinates of P3 and P4, determines a first line from P1 to P2, determines a second line from P3 to P4, determines the x and y coordinates of a point P at the intersection of the first line and the second line, adjusts the calibration DAC code of the I-mixer 1103 to the x-coordinate of P, adjusts the calibration DAC code of the Q-mixer 1105 to the y-coordinate of P, and makes a subsequent data capture, if necessary.

According to an embodiment of the present disclosure, based on the linearity of the 3D graph of the IM2 tone amplitude and I,Q DAC code space in FIGS. 1 and 2, the present apparatus and method provides fast IIP2 calibration that requires as few as four data captures (e.g., four iterations for one data capture per iteration) to determine the optimal I,Q DAC code.

There is a strong dependency between the I-mixer DAC code and the Q-mixer DAC code, i.e., the optimal I-mixer DAC code varies when the optimal Q-mixer DAC code varies and vice versa. The amplitude of the IM2 tone's real part and imaginary part DFT at the calibration code (m, n) may be represented as $A_{adc,i}(m,n)$ and $A_{adc,q}(m,n)$, respectively, where m and n are the I-mixer DAC code and the Q-mixer DAC code indexes, respectively. The present apparatus and method determines the optimal I-mixer and Q-mixer calibration DAC code pair ($m_{opt}$, $n_{opt}$), such that the total energy of IM2 tones of the I-path and the Q-path are minimized as in Equation (2) as follows:

$$(m_{opt}, n_{opt}) = \underset{m,n}{\mathrm{argmin}}(|A_{adc,i}(m, n)|^2 + |A_{adc,q}(m, n)|^2). \quad (2)$$

Therefore, the present two tones based IIP2 calibration apparatus and method provides a fast and accurate searching method (with a minimum of four data captures). In order to improve speed and accuracy, the property of IM2 over the IQ DAC code space is observed. To observe the relationship between IM2 tone level and IQ mixer DAC code, a full-sweep of the IM2 tone level for all the possible DAC code combinations for LTE band 1 in a practical platform may be performed.

According to an embodiment of the present disclosure, the present IIP2 calibration apparatus and method generates two tones for IIP2 calibration either externally or internally.

Figure 12:
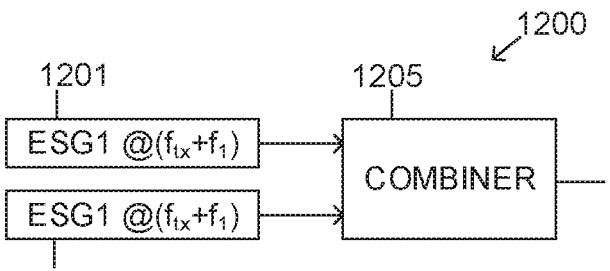
FIG. 12 is a block diagram of an apparatus for generating two tones, according to an embodiment of the present disclosure.

FIG. 12 is a block diagram of an apparatus 1200 for generating two tones, according to an embodiment of the present disclosure. The apparatus 1200 generates two tones externally to the apparatus 1100 of FIG. 11 using external Enterprise Session Initiation Protocol (SIP) Gateways (ESGs).

Referring to FIG. 12, the apparatus 1200 includes a first external ESG (ESG1) 1201, a second ESG (ESG2) 1203, and a combiner 1205.

The first ESG (ESG1) 1201 includes an output.

The second ESG (ESG2) 1203 includes an output.

The combiner 1205 includes a first input connected to the output of the first ESG1 1201, a second input connected to the output of the second ESG2 1203, and an output. The combiner 1205 combines two tones generated by the first ESG1 1201 and the second ESG2 1203, respectively, and transmits the combined tones to the input of the RF LNA 1101 of FIG. 11.

Figure 13:
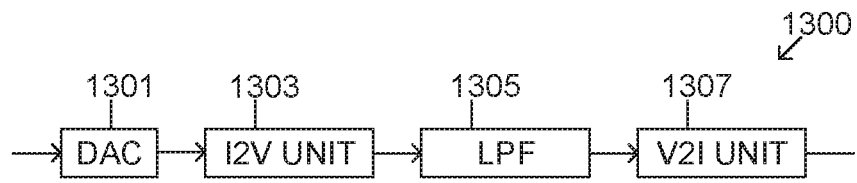
FIG. 13 is a block diagram of an apparatus for generating two tones, according to an embodiment of the present disclosure.

FIG. 13 is a block diagram of an apparatus 1300 for generating two tones, according to an embodiment of the present disclosure. The apparatus 1300 generates two tones internally to the apparatus 1100 of FIG. 11, via either an auxiliary transmitter or by re-using an existing transmitter. If the apparatus 1300 generates two tones internally by using an internal transmitter, the apparatus 1300 may generate two tones by turning off either the I-mixer 1103 or the Q-mixer 1105 of FIG. 11 while injecting a sinusoidal signal to a transmitter DAC.

Referring to FIG. 13, the apparatus 1300 includes a DAC 1301, a current to voltage (I2V) conversion unit 1303, an LPF 1305, and a voltage to current (V2I) conversion unit 1307.

The DAC 1301 includes an input for receiving a sinusoidal signal, and an output.

The I2V unit 1303 includes an input connected to the output of the DAC 1301, and an output.

The LPF 1305 includes an input connected to the output of the I2V unit 1303, and an output.

The V2I unit 1307 includes an input connected to the output of the LPF 1305, and an output connected to the input of the RF LNA 1101 of FIG. 11.

Figure 14:
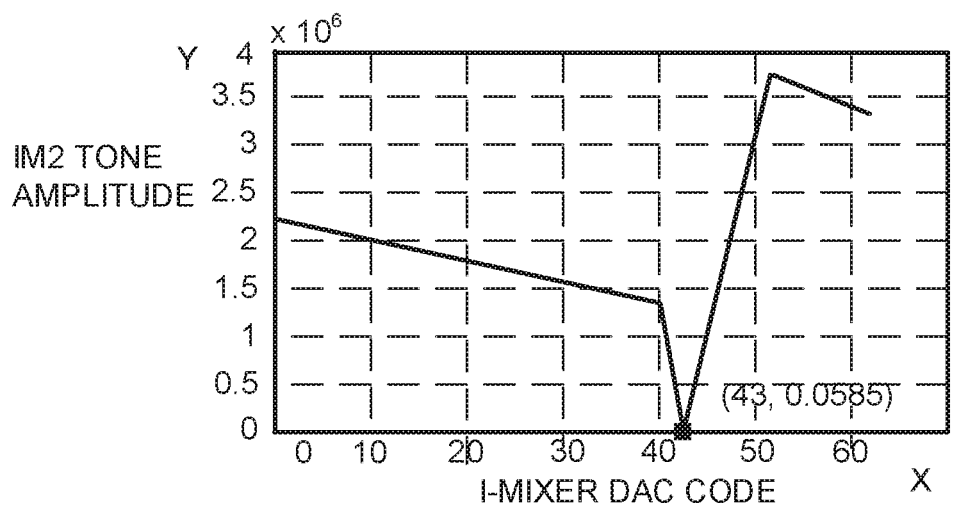
FIG. 14 is a graph of I-mixer DAC code and a distorted IM2 tone amplitude, according to an embodiment of the present disclosure.

FIG. 14 is a graph of I-mixer DAC code and a distorted IM2 tone amplitude, according to an embodiment of the present disclosure.

Referring to FIG. 14, the distorted "V" shape of the IM2 tone amplitude and DAC code indicates that the RF gain of the RF LNA 1101 of FIG. 11 may be set too high such that an input to the ADCs 1111 and 1113 of FIG. 11 is limited, or clipped, to a certain level, which distorts the IM2 tone. According to an embodiment of the present disclosure, more than two data captures may be required to determine a coordinate of a point. As illustrated in FIG. 14, instead of requiring only one data capture at DAC code 0 and 63 as described in the example above, the present apparatus and method may require data captures at DAC codes 0, 63, 40, and 45 to determine a valley point. In this case, the present apparatus and method may lower the RF gain of the RF LNA 1101 in FIG. 11 so that the IM2 tone amplitude received by the ADCs 1111 and 1113 is not clipped. Therefore, before data captures, the present apparatus and method may include automatic gain control (AGC) so that the input to the ADCs 1111 and 1113 is not clipped.

Figure 15:
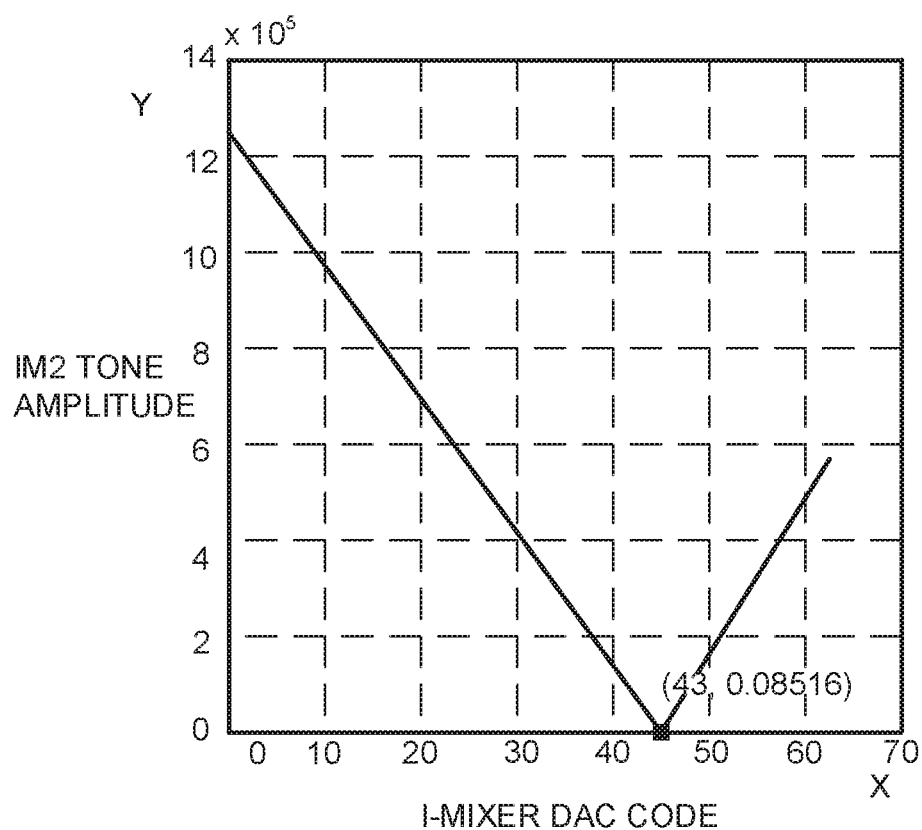
FIG. 15 is a graph of I-mixer DAC code and an ideal V-shaped IM2 tone amplitude, according to an embodiment of the present disclosure.

FIG. 15 is a graph of I-mixer DAC code and an ideal V-shaped IM2 tone amplitude, according to an embodiment of the present disclosure.

Referring to FIG. 15, if the RF gain of the RF LNA 1101 in FIG. 11 is set at a value such that the input to the ADCs 1111 and 1113 is not clipped, then an ideal "V" shape may be obtained. Comparing FIG. 14 with FIG. 15, the valley point for both graphs is approximately the same. However, in FIG. 15, the present apparatus and method may determine the location of the valley point using two data captures (e.g., one for DAC code 0 and another for DAC code 63). Therefore, the present apparatus and method may keep the minimum number of data captures at two for determining an optimal coordinate of one valley point by setting the RF gain of the RF LNA 1101 of FIG. 11 according to various factors including transmit tone power, path loss, and ADC dynamic range.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. An apparatus, comprising:
   a first low pass filter (LPF), including an input configured to receive a real part of a second order intermodulation (IM2) tone, and an output;
   a second LPF, including an input configured to receive an imaginary part of the IM2 tone, and an output;
   a first analog-to-digital converter (ADC), including a first input connected to the output of the first LPF, and an output;
   a second ADC, including a first input connected to the output of the second LPF, and an output;
   a first discrete Fourier transform (DFT) unit, including an input connected to the output of the first ADC, and an output;
   a second DFT unit, including an input connected to the output of the second ADC, and an output;
   an IM2 tone amplitude measurement unit, including a first input connected to the output of the first DFT, a second input connected to the output of the second DFT, and an output; and
   a calibration logic unit, including an input connected to the output of the IM2 tone amplitude measurement unit, a first output, and a second output, configured to apply at least one plane-fitting method to the output of the IM2 tone measurement unit to determine two sets of valley points of wing-shaped surfaces of a real part of a DFT and an imaginary part of the DFT, respectively, and to simultaneously determine an in-phase mixer (I-mixer) digital-to-analog (DAC) code and a quadrature-phase mixer (Q-mixer) DAC code from an intersection of two lines formed from the two sets of valley points.

2. The apparatus of claim 1, further comprising:
a radio frequency (RF) low noise amplifier (LNA), including an input to receive two tones at frequencies $f_{tx}+f_1$ and $f_{tx}+f_2$, and an output, where $f_{tx}$ is a center frequency of a transmit band, and a tone spacing $|f_2-f_1|<f_c$, where $f_c$ is a cut-off frequency of the first LPF and the second LPF;
an I-mixer, including a first input connected to the output of the RF LNA, a second input connected to the first output of the calibration logic unit to receive an I-mixer digital-to-analog (DAC) code, and an output connected to the input of the first LPF; and
a Q-mixer, including a first input connected to the output of the RF LNA, a second input connected to the second output of the calibration logic unit to receive a Q-mixer DAC code, and an output connected to the input of the first LPF,
where the I mixer and the Q-mixer operate at $f_{rx}$, where $f_{rx}$ is a center frequency of a receiver band, and $f_{offset}=f_{rx}-f_{tx}$ is a duplex spacing, which is greater than $f_c$.

3. The apparatus of claim 1, further comprising:
a first enterprise session initiation protocol gateway (ESG), including an output;
a second ESG, including an output, and
a combiner, including a first input connected to the output of the first ESG, a second input connected to the output of the second ESG, and an output connected to the input of the RF LNA.

4. The apparatus of claim 1, further comprising:
a digital to analog converter (DAC), including an input for receiving a sinusoidal signal, and an output;
a current to voltage converter (I2V), including an input connected to the output of the DAC, and an output;
an LPF, including an input connected to the output of the I2V, and an output;
a voltage to current converter (V2I), including an input connected to the output of the LPF, and an output,
wherein either the I-mixer or the Q-mixer is turned off.

5. The apparatus of claim 1, wherein the IM2 tone amplitude measurement unit is configured to measure amplitudes of real parts and imaginary parts of the outputs of the first DFT and the second DFT.

6. The apparatus of claim 1, wherein the RF LNA includes automatic gain control (AGC).

7. The apparatus of claim 1, wherein the calibration logic unit is configured to:
determine an x-coordinate of a point P1 based on amplitudes of a DFT real part of a second captured data and a fourth captured data;
determine an x-coordinate of a point P2 based on amplitudes of the DFT real part of a first captured data and a third captured data;
determine an y-coordinate of a point P3 based on amplitudes of a DFT imaginary part of the first and second captured data;
determine an y-coordinate of a point P4 based on amplitudes of the DFT imaginary part of the third and fourth captured data;
form a first line from P1 to P2;
form a second line from P3 to P4;
determine an x-coordinate of a point P at the intersection of the first line and the second line as an optimal I-mixer DAC code setting; and
determine a y-coordinate of P as an optimal Q-mixer DAC code setting.

8. The apparatus of claim 7, wherein the calibration logic unit is further configured to determine an x-coordinate or a y-coordinate of a point, based on a similarity between a first triangle and a second triangle on a graph, and calculate $$|BC| = \frac{|AB| \times |BE|}{|AB| + |DE|},$$

where A, B, and C are points that define the first triangle, C, D, and E are points that define the second triangle, AB and BC are lines in the first triangle, DE is a line in the second triangle, and BE is a line from the first triangle to the second triangle that passes through C.

9. The apparatus of claim 1, wherein the I-mixer and the Q-mixer each produce an output that falls within an analog baseband that is captured by the first ADC and the second ADC, respectively.

10. The apparatus of claim 7, wherein the calibration logic unit is further configured to capture additional data if a shape of an IM2 tone amplitude is distorted.

11. A method, comprising:
receiving, by a first low pass filter (LPF), a real part of a second order intermodulation (IM2) tone;
receiving, by a second LPF, an imaginary part of the IM2 tone;
converting, by a first analog-to-digital converter (ADC), an output of the first LPF;
converting, by a second ADC, an output of the second LPF;
transforming, by a first discrete Fourier transform (DFT) unit, an output of the first ADC;
transforming, by a second DFT unit, an output of the second ADC;
measuring, by an IM2 tone amplitude measurement unit, an output of the second DFT;
apply at least one plane-fitting method to the output of the IM2 tone measurement unit to determine two sets of valley points of wing-shaped surfaces of a real part of a DFT and an imaginary part of the DFT, respectively; and
determining simultaneously an in-phase mixer (I-mixer) digital-to-analog (DAC) code and a quadrature-phase mixer (Q-mixer) DAC code from an intersection of two lines formed from the two sets of valley points, by a calibration logic unit, from an output of the IM2 tone amplitude measurement unit.

12. The method of claim 11, further comprising:
receiving two tones at frequencies $f_{tx}+f_1$ and $f_{tx}+f_2$ and a tone spacing $|f_2-f_1|<f_c$, by a radio frequency (RF) low noise amplifier (LNA), where $f_{tx}$ is a center frequency of a transmit band, and where $f_c$ is a cut-off frequency of the first LPF and the second LPF;
receiving, by an I-mixer including a first input connected to an output of the RF LNA, a second input connected to the first output of the calibration logic unit to receive an I-mixer digital-to-analog (DAC) code, and an output connected to the input of the first LPF; and receiving, by a Q-mixer, including a first input connected to the output of the RF LNA, a second input connected to the second output of the calibration logic unit to, and an output connected to the input of the first LPF, a Q-mixer DAC code;

where the I mixer and the Q-mixer operate at $f_{rx}$, where $f_{rx}$ is a center frequency of a receiver band, and $f_{offset}=f_{rx}-f_{tx}$ is a duplex spacing, which is greater than $f_c$.

13. The method of claim 11, further comprising:

generating a first tone externally, by a first enterprise session initiation protocol gateway (ESG);

generating a second tone externally, by a second ESG, combining, by a combiner, an output of the first ESG and output of the second ESG; and transmitting the result of the combination to the RF LNA.

14. The method of claim 11, further comprising:

receiving, by a digital to analog converter (DAC), a sinusoidal signal;

converting, by a current to voltage converter (I2V), an output of the DAC;

filtering, by an LPF, an output of the I2V;

converting, by a voltage to current converter (V2I), an output of the LPF, wherein either the I-mixer or the Q-mixer is turned off.

15. The method of claim 11, wherein the IM2 tone amplitude measurement unit is configured to measure amplitudes of real parts and imaginary parts of the outputs of the first DFT and the second DFT.

16. The method of claim 11, further comprising controlling gain of the RF LNA automatically.

17. The method of claim 11, further comprising:

determining, by the calibration logic unit, an x-coordinate of a point P1 based on amplitudes of a DFT real part of a second captured data and a fourth captured data;

determining, by the calibration logic unit, an x-coordinate of a point P2 based on amplitudes of the DFT real part of a first captured data and a third captured data;

determining, by the calibration logic unit, an y-coordinate of a point P3 based on amplitudes of the DFT imaginary part of the first and second captured data;

determining an y-coordinate of a point P4 based on amplitudes of a DFT imaginary part of the third and fourth captured data;

forming a first line from P1 to P2;

forming a second line from P3 to P4;

determining an x-coordinate of a point P at the intersection of the first line and the second line as an optimal I-mixer DAC code setting; and determining a y-coordinate of P as an optimal Q-mixer DAC code setting.

18. The method of claim 17, further comprising, by the calibration logic unit, determining an x-coordinate or a y-coordinate of a point, based on a similarity between a first triangle and a second triangle on a graph, and calculating $$|BC| = \frac{|AB| \times |BE|}{|AB| + |DE|},$$

where A, B, and C are points that define the first triangle, C, D, and E are points that define the second triangle, AB and BC are lines in the first triangle, DE is a line in the second triangle, and BE is a line from the first triangle to the second triangle that passes through C.

19. The method of claim 11, further comprising:

producing, by each of the I-mixer and the Q-mixer, an output that falls within an analog baseband; and capturing, by the first ADC and the second ADC, the output of the I-mixer and the Q-mixer, respectively.

20. The method of claim 17, further comprising, capturing, by the calibration logic unit, additional data if a shape of an IM2 tone amplitude is distorted.

* * * * *